US006517736B1

(12) United States Patent
Flannery et al.

(10) Patent No.: US 6,517,736 B1
(45) Date of Patent: Feb. 11, 2003

(54) THIN FILM GASKET PROCESS

(75) Inventors: Anthony Flannery, Monte Sereno, CA (US); Nicholas J. Mourlas, Berkeley, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/418,121

(22) Filed: Oct. 14, 1999

Related U.S. Application Data

(60) Provisional application No. 60/104,261, filed on Oct. 14, 1998.

(51) Int. Cl.$^{7}$ .................................................. B81B 1/00

(52) U.S. Cl. ............................. 216/33; 216/39; 216/79; 216/80; 216/97; 216/99; 264/46.6

(58) Field of Search ................................ 216/2, 27, 33, 216/39, 79, 80, 97, 99; 137/833, 384; 264/46.6, 632

(56) References Cited

U.S. PATENT DOCUMENTS

| | | | | |
|---|---|---|---|---|
| 5,259,737 A | * 11/1993 | Kamisuki et al. | ........... | 417/322 |
| 5,376,252 A | 12/1994 | Ekstron et al. | ......... | 204/299 R |
| 5,443,890 A | 8/1995 | Ohman | ...................... | 428/167 |
| 5,824,204 A | * 10/1998 | Jerman | ...................... | 204/601 |

* cited by examiner

*Primary Examiner*—Allan Olsen
(74) *Attorney, Agent, or Firm*—Lumen Intellectual Property Services, Inc.

(57) ABSTRACT

A micro-fluidic device is disclosed with a gasket layer laminated between a silicon wafer patterned with channels and a glass wafer. The gasket layer is formed in two parts. A first portion of the gasket layer is formed on the inner walls of the channels and along the channel edges. A complimentary gasket is formed on the glass wafer. The silicon wafer and the glass wafer are anodically bonded together through their respective surface to enclosed channels or portions thereof. The fluidic properties of the micro-fluidic devices are altered depending on the gasket material that is used. In the preferred embodiments of the invention, the gasket material is selected from the group consisting of silicon carbide and silicon nitride.

11 Claims, 2 Drawing Sheets

THIN FILM GASKET PROCESS

RELATED APPLICATIONS

This application is based on a provisional patent application No. 60/104,261 filed Oct. 14, 1998 which is hereby incorporated by reference.

This invention was supported in part by grant number N66001-96-C-8631 from the Defense Advanced Research Projects Agency (DARPA) and the Office of Naval Research (ONR). The Government has certain rights in the invention.

FIELD OF THE INVENTION

This invention relates generally to multi-layer micro-fluidic devices. More specifically, the invention relates to micro-fluid devices with patterned channels that are sealed by a thin film gasket process.

BACKGROUND

Micro-fluidic devices have several implicated applications in fluid management systems. In particular micro-fluidic devices are being examined for applications in the field of separation technology. For example, micro-fluidic devices may be used in electrophoretic separation systems and capillary separations systems. Micro-fluidic devices also have applications as fluid guides or switches in other managed flow systems.

In general micro-fluidic devices with enclosed and/or sealed channels are fabricated in multi-layer processes, whereby channels are patterned onto a suitable substrate. The channel configuration and the channel dimensions are determined by patterning process that is used. In a subsequent step a capping wafer is secured to the patterned substrate through a bonding process that encloses and seals the patterned channels. Most commonly the patterned substrate is a silicon wafer that is patterned by an etching process. Both the substrate material and the etching process that is used effect the dimensional uniformity, shapes and sizes of the channels produced, while the type of substrates and the channel geometryies effect the fluidic properties.

There are several limitations to the micro-fluidic devices that are described in the prior art. One limitation is that a bonding material must be introduced between patterned wafer and capping wafer in order to secure the wafers and to seal the micro-channels. A second limitation is that micro-fluidic devices described in the prior art are limited in their fluidic properties by the wafer materials used. For example, if the micro-fluidic device is made by etching channels in a silicon wafer, and the channels are enclosed with a capping silicon wafer, the inner channel surfaces are silicon surfaces. Therefore, the fluidic properties of the device are to a large degree determined by the silicon wafer. Silicon is often a preferred wafer material in the fabrication process of micro-fluidic devices, but there are several applications for micro-fluidic devices where the inner channel surfaces of the device used are preferably non-silicon surfaces. Examples where silicon channel surfaces are not perferred include situations where fluid solutions are reactive to the silicon surfaces or where the fluid solutions contain materials that adhere strongly to the silicon surfaces and reduce throughput of the device.

In U.S. Pat. No. 5,443,890, Öhman describes a micro-fluidic device that is fabricated by patterning two sets of channels in a silicon wafer. A second wafer is placed on top of the patterned wafer and a sealing/bonding material is injected into the one set of channels in order to adhere the wafers together and seal the channels. The channel walls are silicon surfaces and, therefore, the chemistries and separations properties of devices produced by this method can only be altered by the dimensions of the channels. Ekstrom et al., in U.S. Pat. No. 5,376,252 describe a micro-fluidic device that is made by laminating a molded spacer layer or layers between two wafers, whereby the spacer layer define the side walls of the channels. Because the spacer layer materials define portions of the enclosed channels the material used for the spacers will effect the fluidic properties of the device. However, substantial portions of the channel surfaces are still dictated by the wafer materials used to laminate the spacer materials. Further, Ekström et al. do not describe or suggest a method for sealing and securing the wafers together.

What is needed is a method to produce micro-fluidic devices from silicon based materials where the channels of the device have modified channel surfaces tailored to the application at hand. Further, what is need is a method for securing wafers together and sealing the channels in micro-fluidic devices, which does not require the injection of an additional bonding material. The method should provide avenues to produce a variety of devices with different geomerties and with different fluidic properties.

SUMMARY OF THE INVENTION

An object of the present invention is to provide a micro-fluidic device that is suitable for use in separations and fluid management systems. The device can be fabricated with channels of various dimensions and a variety of surface properties.

The object of the present invention is accomplished by patterning a substrate with a silicon-based working surface. The substrate is a silicon wafer or any other substrate with a layer of silicon-based material defining the working surface. The working surface of the wafer is etched to define the approximate channel configuration and channel dimensions. It is preferably that the channel walls have sharp dimensional features, which can be accomplished by Deep Reactive Ion Etching processes.

Once the wafer has been patterned with the channels, a gasket layer is conformally deposited across the silicon-based working surface of the substrate and on the channel walls. For example, a layer of silicon carbide or silicon-nitride is deposited by a CVD method. The material used to deposit the gasket layer substantially defines the fluidic properties of the channel walls and the device that is produced. Suitable gasket material include any material that can be conformally deposited over the irregular surfaces of the patterned silicon surface and which will not break down during the anodic bonding process described below. For example, the gasket material can be a fluorinated material, metallic materials, glass material or a polymeric materials deposited by a method suitable for the material In a subsequent step, a relief gasket is patterned by removing predetermined portions of the gasket layer from the working surface of the substrate while leaving the portions the gasket layer within the channels and along the channel edges. The relief gasket may be patterned by any suitable technique known in the art including using metal and photo-resist masks.

A second substrate is provide with a glass-based working surface and complimentary relief gasket that can be overlaid on the relief gasket described above. The glass working surface must be capable of being anodically bonded to the silicon-based working surface of the patterned substrate.

The complimentary relief gasket is made from a variety of materials, but is typically made from the same material as the first relief gasket.

The two wafers are then aligned with the relief gaskets overlaid and the substrates anodically bonded together through their respective working surface. The anodic bonding secures the substrates together with sufficient strength to seal the channels.

DETAILED DESCRIPTION OF THE PERFERRED EMBODIMENT

In the preferred embodiment of the current invention a multi-layer micro-fluidic device has a silicon layer that has been etched with a micro-channel configuration. A gasket structure that covers the inner channel walls and the edges of the channels is laminated between the etched silicon wafer layer and a glass layer. Portions of the silicon layer and glass layer surface are bonded by an anodic process that secures the silicon layer and the glass layer together and seals the channels through the gasket structure. FIGS. 1*a*–1*g* will now be used to illustrate the perferred method for producing the micro-fluidic device describe above.

Figure 1A:
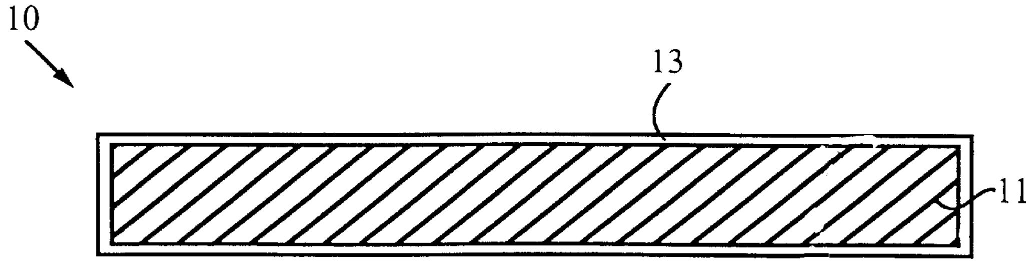
FIG. 1*a* shows cross-sectional view of silicon wafer with an oxide layer.

FIG. 1*a* shows a cross-sectional view of the silicon wafer 10 with a silicon inner portion 11 and a silicon oxide layer 13. It is preferred that the silicon wafer 10 used in the method of the invention has the oxide layer 13, which serves as an etch stop in a later fabrication step. However, a simple native silicon wafer, a doped silicon wafer or any suitable substrate with a silicon-based working surface is considered to be within the scope of the present invention. What is important is that the silicon-based working surface provided is capable of being etched by a process described below to produce channels and that it is suitable for being anodically bonded to a glass surface.

Figure 1B:
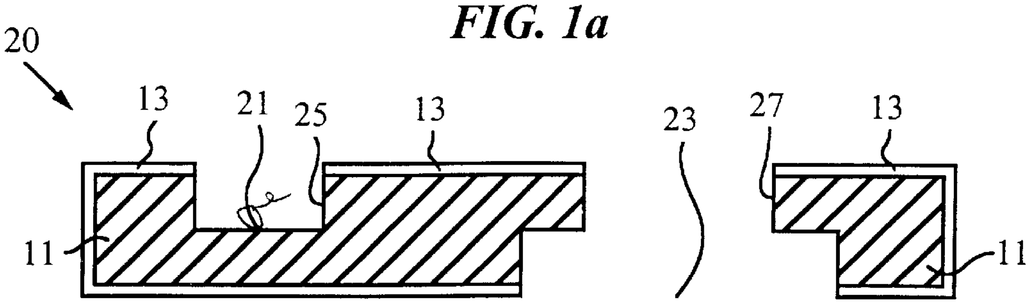
FIG. 1*b* shows a cross-sectional view of the silicon wafer shown in FIG. 1*a* patterned with channels.

FIG. 1*b* shows a cross-sectional view of a silicon wafer structure 20 patterned with a channel 21 and a through-wafer channel or port 23. The structure 20 is generated by masking and etching the silicon wafer 10 (shown in FIG. 1*a*) by any suitable method known in the art. For example, the channels 21 and 23 can be formed by providing a patterned photoresist mask and etching the channels with potassium hydroxide. It is preferable that the channels 21 and 23 are formed by a method that is capable of deep etching and that will produce channels with high lateral definition or steep channel walls 25 and 27. This is preferably accomplished by etching the channels 21 and 23 by Deep Reactive Ion Etching (DRIE) processes well known in the art.

Figure 1C:
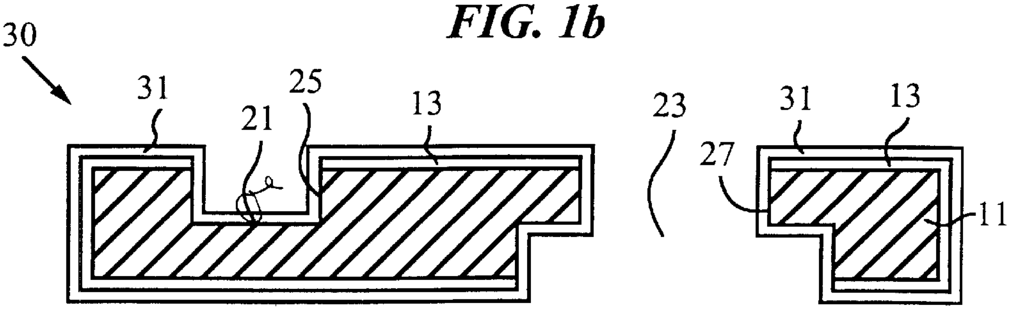
FIG. 1*c* shows a thin film deposited on the patterned silicon wafer of FIG. 1*b* according to the present invention.

FIG. 1*c* shows a cross sectional view of a wafer structure 30 with a conformal thin film 31. The wafer structure 30 is produced by depositing the thin film 31 over the working surface 13 and within channels 21 and 23, such that the walls of the channels 25 and 27 are covered with the layer 31. The layer 31 is preferably a silicon carbide layer or a silicon nitride layer deposited to a thickness of between 0.5 to 1.5 micron. Silicon carbide layers and silicon nitride layers of this thickness are readily formed by chemical vapor deposition processes well known in the art. It will be clear to one of average skill in the art that the structure 30 can be produced by depositing any material that is compatible with the working surface 13 and the channel surfaces 25 and 27 and which is capable of withstanding the anodic bonding process described below. For example, the layer 31 can be glass, metal or a fluorinated material deposited by appropriate methods such as sputtering.

Figure 1D:
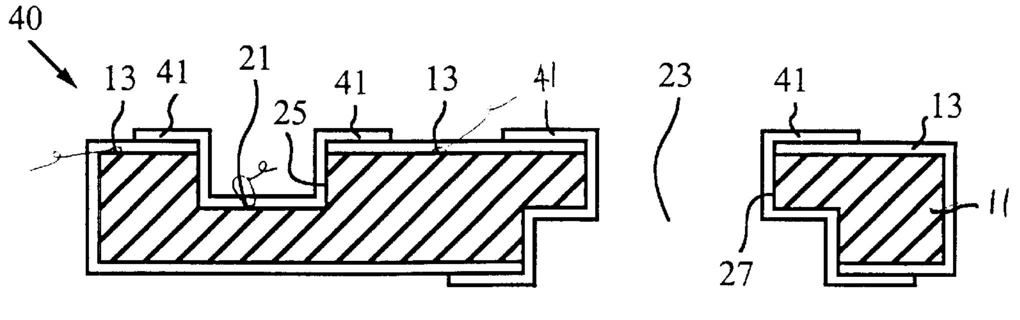
FIG. 1*d* shows cross sectional view of a silicon wafer structure with the thin film shown FIG. 1*c* patterned to form a relief gasket according to the present invention.

FIG. 1*d* shows a cross-sectional view of a wafer structure 40 with a relief gasket 41 outlining edges of the channels 21 and 23. The relief gasket 41 is formed by patterning the conformal thin layer 31 on the wafer structure 30 (shown in FIG. 1*c*). The conformal thin layer 31 is patterned by any suitable method consistent with the material used in the layer 31. The silicon oxide layer 13 serves as a convenient etch stop during patterning of layer 31 to form the relief gasket 41.

Figure 1E:
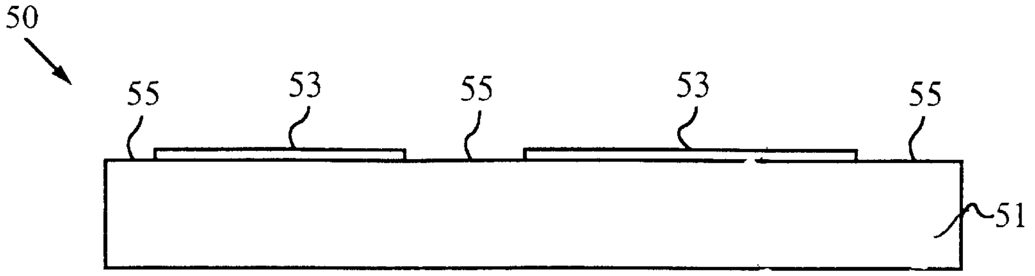
FIG. 1*e* shows a cross-sectional view of a glass wafer structure with a complimentary relief gasket patterned to overlay the relief gasket shown in FIG. 1*d*.
Figure 1F:
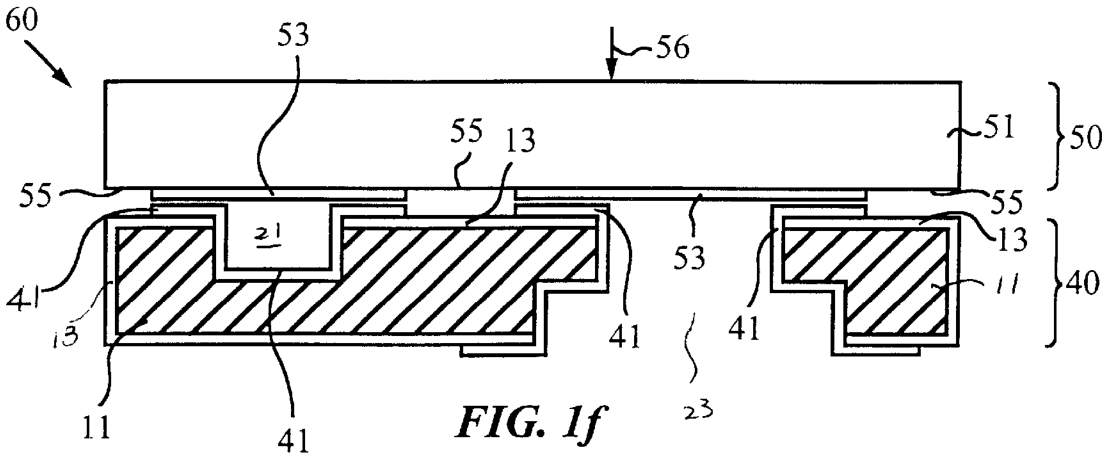
FIG. 1*f* shows the alignment of the silicon wafer structure shown in FIG. 1*d* and the glass wafer structure shown in FIG. 1*e*.
Figure 1G:
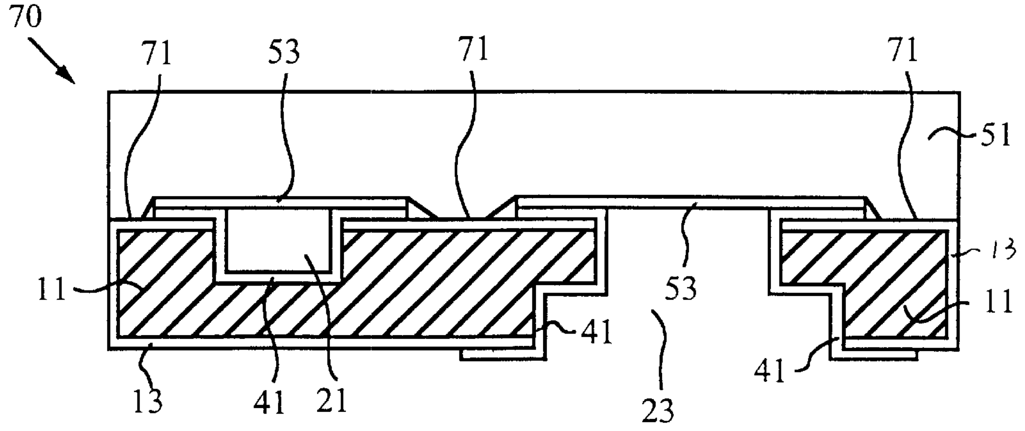
FIG. 1*g* shows a cross section view of a micro-fluidic device made in accordance with the present invention.

FIG. 1*e* shows a cross-sectional view of a glass wafer structure 50 that is the second part in the assembly and fabrication of the micro-fluidic device shown in FIG. 1*g*. The glass wafer structure has glass wafer substrate 51 with complimentary relief gasket 53 that is patterned on the glass working surface 55. The complimentary relief gasket 53 is patterned to be the mirror image of the outlining regions of the relief gasket 41 such that the relief gasket 53 can be overlaid on the relief gasket 41 shown in FIG. 1*f*. The relief gasket 53 is formed by depositing a thin layer (as described in FIG. 1*c*) on the glass working surface 55. The thin layer is then patterned into the relief gasket 53 using methods previously described for FIG. 1*d*. The relief gasket 53 is preferably made of the same material as the relief gasket 41, but may also be a different material. Also, it is not required that the wafer 51 is a glass wafer. It is sufficient that a glass layer is provided on a suitable substrate that facilities the anodic bonding process described below.

Now referring to FIG. 1*f*, the silicon wafer structure 40 (shown in FIG. 1*d*) and the glass wafer structure 50 (shown in FIG. 1*e*) are aligned so that the relief gasket 41 and the complimentary relief gasket 53 overlay in the structure 60 as shown. After the alignment of the structures 40 and 50, the structures 40 and 50 are anodically bonded together through the surfaces 13 and 55. Anodic bonding is a method of bonding glass surfaces and silicon surfaces that is well known in the art. Briefly, the anodic bonding is accomplished by applying a negative voltage to the surface 56 of the glass wafer 51 to generate a field strength in the range of 4000 to 12000 Volts/cm. The anodic bonding generally requires elevated temperatures in a range of 100° C. to 400° C. The specific condition under which the anodic bonding takes place will depend on particular design parameters of the device and the materials used.

FIG. 1*g* shows a cross-sectional view of the micro-fluidic device structure 70 made according to the perferred method of the current invention. The device structure 70 has an enclosed channel 21 that is sealed with a gasket material comprising the gasket 41 and 53 formed by the method described above. The walls of the channels 25 and 27 are lined with the gasket material and, therefore, have significantly different fluidic properties from the channels produced by the prior art methods. The anodic bonding regions 71 formed through the surface 13 and 55 provide sufficient strength to hold the wafer structures together and seal the channel 21 with out requiring additional bonding material.

It will be clear to one skilled in the art that the above embodiment may be altered in many ways without departing from the scope of the invention. For example, several channel configurations are possible. The channels can be open channels, such as 23 of FIG. 1*g*, or enclosed channels, such as 21 of FIG. 1*g*. Further, the glass surface can be patterned with channels and the method described herein can be used to build additional channeled and non-channeled layers into a micro-fluidic structure. Accordingly, the scope of the invention should be determined by the following claims and their legal equivalents.

What is claimed is:

1. A method of making a micro-channel device said method comprising the steps of:

a) providing a first wafer patterned with at least one channel on a silicon-based working surface of first said wafer;

b) depositing a layer of a first gasket material on said silicon-based working surface and in said channel;

c) patterning said first gasket material to produce a first relief gasket with said first gasket material outlining edges of said channel on said silicon-based working surface;

d) providing a second wafer with a glass-based working surface and a second relief gasket on said glass-based working surface, wherein said second relief gasket is capable of overlaying said first relief gasket; and e) aligning said first relief gasket and said second relief gasket; and f) anodically bonding regions of said silicon-based working surface and said glass-based working surface; wherein, said first relief gasket and said second relief gasket form a channel seal between said first wafer and said second wafer.

2. The method of claim 1 wherein said second relief gasket forms a cover over said channel.

3. The method of claim 1 wherein said first silicon-based working surface is a silicon-oxide layer formed on a said first wafer and wherein said first wafer is a silicon wafer.

4. The method of 3 wherein said first gasket material comprises a gasket material selected from the group consisting of a silicon carbide and a silicon nitride.

5. The method of claim 1 wherein said at least one channel is etched by a process selected from the group consisting of deep reactive ion etching (DRIE) and anisotropic wet etching.

6. The method of claim 1 wherein said first gasket material is deposited by a deposition process selected from the group consisting of sputtering, LPCVD, PECVD and OMCVD.

7. The method of claim 1, wherein said second wafer is glass wafer.

8. The method of claim 1, wherein said second wafer is patterned with at least one channel.

9. The method of claim 1, wherein said second relief gasket is made from a material that is the same as said first gasket material.

10. The method of 1, further comprising a step of:

etching a pattern around edges of said channel prior to step b) and wherein step b) fills in said pattern with said first gasket material.

11. The method of claim 1 wherein said at least one channel is a deep channel that goes through said wafer.

* * * * *